United States Patent
Slowig et al.

(10) Patent No.: US 6,836,411 B2
(45) Date of Patent: Dec. 28, 2004

(54) OPERATING DEVICE INCLUDING HOUSING AND PRINTED CIRCUIT BOARD FOR A VEHICLE

(75) Inventors: Yvonne Slowig, Lippstadt (DE); Rolf Broelemann, Salzkotten (DE)

(73) Assignee: Goodrich Hella Aerospace Lighting Systems GmbH, Lippstadt (DE)

( * ) Notice: Subject to any disclaimer, the term of this patent is extended or adjusted under 35 U.S.C. 154(b) by 0 days.

(21) Appl. No.: 10/392,980

(22) Filed: Mar. 21, 2003

(65) Prior Publication Data

US 2003/0196877 A1 Oct. 23, 2003

Related U.S. Application Data

(60) Provisional application No. 60/380,292, filed on May 15, 2002.

(30) Foreign Application Priority Data

Mar. 23, 2002 (DE) .......................................... 102 13 095

(51) Int. Cl.$^7$ .............................. H01H 9/00; H05K 7/14
(52) U.S. Cl. ........................ 361/752; 200/296; 361/759; 361/801; 361/802
(58) Field of Search ................................ 200/294–296; 361/627, 728, 740, 747, 752–759, 801, 802; 248/27.3

(56) References Cited

U.S. PATENT DOCUMENTS

| 4,105,883 | A | * | 8/1978 | Hastings et al. ............ 200/296 |
| 4,750,091 | A | | 6/1988 | Van Hout |
| 5,642,263 | A | * | 6/1997 | Lauruhn ...................... 361/801 |
| 6,285,556 | B1 | * | 9/2001 | Guth et al. .................. 361/752 |

FOREIGN PATENT DOCUMENTS

| DE | 83 28 123 U1 | 2/1984 | |
| DE | 100 01 053 C1 | 1/2001 | |
| DE | 10001053 C1 | * 1/2001 | .......... H01H/13/04 |
| EP | 0744886 A1 | * 11/1996 | ............ H05K/7/14 |
| EP | 0 841 673 A2 | 5/1998 | |
| EP | 0 984 673 A1 | 3/2000 | |

* cited by examiner

*Primary Examiner*—James R. Scott
(74) *Attorney, Agent, or Firm*—Birch, Stewart, Kolasch, & Birch, LLP

(57) ABSTRACT

An operating device for a vehicle, such as an airplane or a bus, includes a board that is adapted to carry electronic circuits, and at least two catch hooks for receiving the board between them. Each of the catch hooks has a contact portion for retaining the board and a base part for supporting the contact portion. The base parts of the catch hooks face each other, and the contact portions face away from each other. When the board is loaded, the catch hooks are pressed towards the respectively other catch hook which results in that the catch hooks lean more and more firmly against the board when force is induced onto the board.

10 Claims, 5 Drawing Sheets

OPERATING DEVICE INCLUDING HOUSING AND PRINTED CIRCUIT BOARD FOR A VEHICLE

This nonprovisional application claims priority under 35 U.S.C. §119(a) on Patent Application No. 102 13 095.7 filed in Germany on Mar. 23, 2002, and U.S. Provisional Application No. 60/380,292 filed on May 15, 2002, both of which are herein incorporated by reference.

BACKGROUND OF THE INVENTION

1. Field of the Invention

The present invention relates to an operating device, particularly for vehicles, such as, for example, airplanes or buses, and particularly relates to an operating device comprising a board, such as a printed circuit board carrying the electronics, the board being fastened by, for example, of a special catch connection.

2. Description of the Background Art

Almost all means of transport are equipped with key buttons as operating devices for drive functions or service functions. Typically, these key buttons were composed of a front panel integrated into the interior covering panels and a switching portion located behind it and being operable by means of the front panel, which is typically arranged directly on a printed circuit board so that the switching information can be directly transmitted to a monitor or evaluation circuit.

A problem with this arrangement is that the printed circuit board has to take up the force applied upon actuation of the key button. This requires a special fastening of the printed circuit board. For the purposes of exchange and repair, the fastening of the printed circuit board should be releasable.

To this end, front panels with catch hooks exist that first bend apart upon insertion of the printed circuit board and move back again when the printed circuit board has reached a final position, so that the printed circuit board is locked into place. Typically, these catch hooks are arranged at the border of the printed circuit board and receive the latter between them. Operating devices comprising a printed circuit board held by such catch hooks are known from DE-C-100 01 053, DE-U-83 28 123, EP-A-0 841 673 and U.S. Pat. No. 4,750,091. Further, an operating element is known from EP-A-0 984 673 the housing of which consists of interlocked parts.

Each catch hook of known operating devices consists of a flexible base part permitting the bending-apart and a contact portion arranged at the end of the base part, for retaining the printed circuit board. The contact portion engages over the border of the printed circuit board and is supported there to secure the printed circuit board against pressure. If now, upon the actuation of an operating element (e.g., key button) located on the printed circuit board, pressure is exerted upon it, a force arises that is directed away from the front face of the operating device. Up from a certain force acting upon the printed circuit board, caused by actuating a key button, for example, the connection between the printed circuit board and the conventional catch hook is undone by the corresponding torque, since the catch hooks bend outward so far until they no longer engage the printed circuit board. Then, the printed circuit board is no longer secured and is displaced out of its position by a further induction of force, which leads to an undesired failure of the key buttons.

SUMMARY OF THE INVENTION

It is, therefore, an object of the present invention to provide an operating device for a vehicle with an improved fastening of the board.

In order to solve this object, the invention suggests an operating device for vehicles, being provided with a board, and at least two encompassing elements receiving the board between them, each of which comprises a contact portion retaining the board and a base part supporting the contact portion.

In this operating device, it is provided, according to the invention, that at least one of the encompassing elements is configured as an elastic catch hook and that the contact portion of the at least one catch hook is arranged on that side of its base part that faces away from the respective other encompassing element, wherein, upon the exertion of force upon the board in the direction of the contact portion of the at least one catch hook, the latter can be subjected to a torque towards the respective other encompassing element.

The invention suggests an operating device in which at least one encompassing element is configured as an elastically bendable catch hook the base part of which faces the opposed encompassing element and the contact portion of which faces away from the opposed encompassing element. When the board is loaded in the direction of the normal line of the board and onto the contact portions of the encompassing element or catch hook, a torque is exerted onto the at least one catch hook in the direction of the encompassing element. This results in that the catch hook is pressed even more strongly onto the board when loaded. This, in turn, results in that the board cannot be released from between the catch hook and the other encompassing element that has, in this case, a substantially rigid configuration, even in case of a very great force.

Preferably, an acute angle (i.e. an angle smaller than 90°) is formed between the contact portion and the base part so that the contact portion is supported on the board with an edge and not with a surface. This facilitates the movement of the contact portion over the board when the latter is locked into place and increases the torque in case of loads acting upon the board.

Preferably, recesses are provided at the border of the board in which the catch hook and/or the encompassing member are arranged. This arrangement provides for a particularly stable fixing of the board.

Advantageously, the contact portion of the catch hook rises above the recesses in the board at two opposed recess borders so that the base part of the catch hook is able to move in the recess whereas the contact portion is supported on the board and holds the latter. As an alternative or in addition thereto, the contact portion rises above the border of the recess connecting the two afore-mentioned borders.

The board can be configured as a printed circuit board with or for electric and/or electronic circuits or components.

Preferably, the one encompassing element, which is not formed as a catch hook is rigid. This encompassing element can also extend over the entire lateral edge of the board or a part thereof.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE FIGURES

The present invention will become more fully understood from the detailed description given hereinbelow and the accompanying drawings which are given by way of illustration only, and thus, are not limitive of the present invention, and wherein.

DETAILED DESCRIPTION

Figure 1:
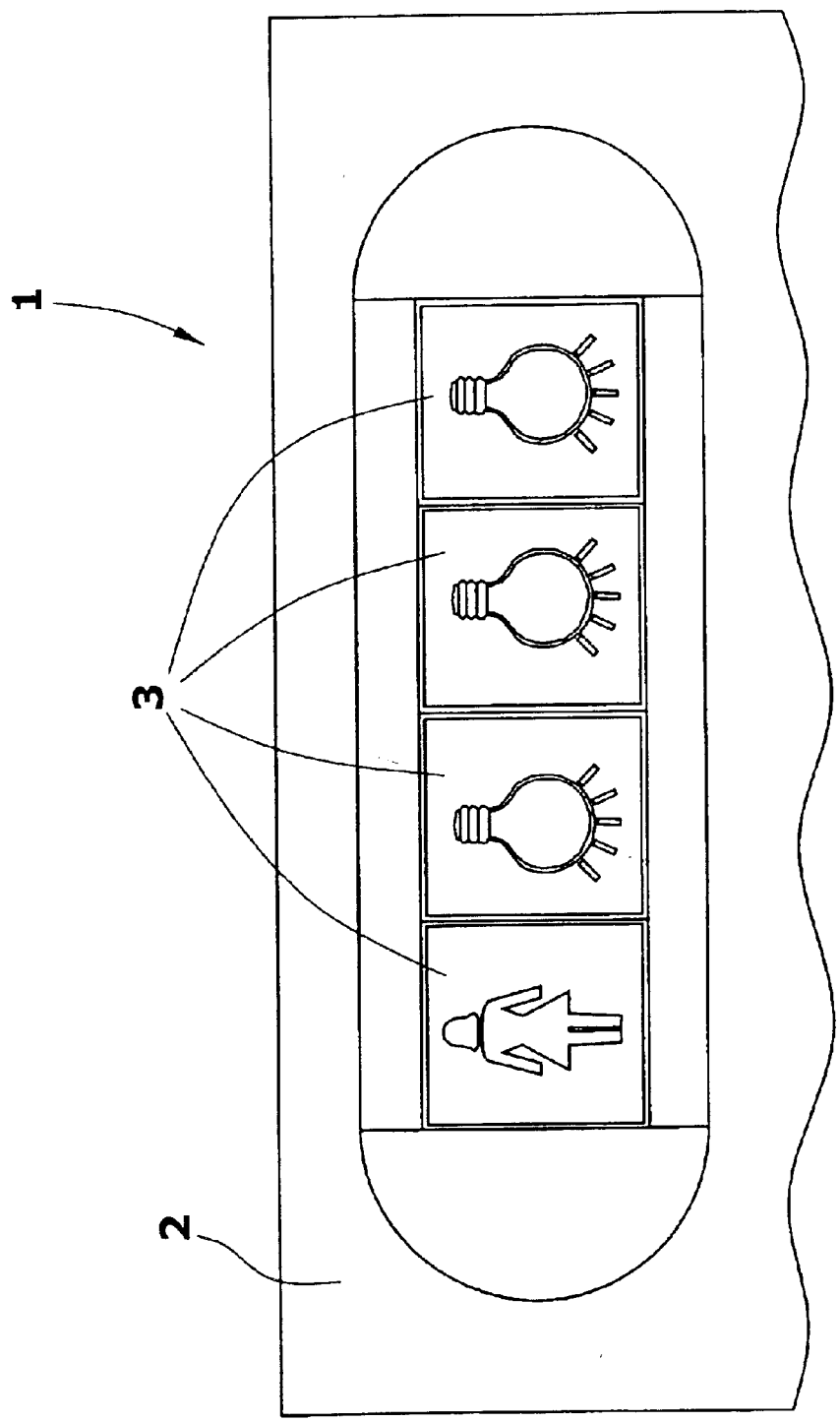
FIG. 1 shows a front view of an operating device for a vehicle according to the invention, comprising various key buttons and symbols in a front panel.

An operating device 1 for vehicles, such as airplanes or buses, shown in FIG. 1, has a panel 2 integrated into the interior fittings of the vehicle, and several key buttons 3 which are adapted to have different functions. In, for example, airplanes, these functions are typically the actuation of lights above the seats and the calling of flight attendants.

With reference to FIGS. 2–5, the function of the operating device 1 according to the invention is now explained. Behind the panel 2, a board 4 is held, which is a printed circuit board and carries circuits for detecting and evaluating the switching positions of the various key buttons 3. The board 4 is held by several opposed catch hooks 5 (FIGS. 3,5) arranged at, for example, longitudinal sides of the board 4. The number of the catch hooks 5 may be varied according to the length of the board 4 and according to the strength of the fastening. Preferably, at least four catch hooks 5 should be used. Each catch hook has a base part 6 fastened to the panel 2 and a contact portion 7 arranged at the end of the base part 6 facing away from the panel 2 and being supported on the side of the board 4 facing away from the panel 2. The length of the base part 6 is dimensioned such that, when the board 4 is supported on support ribs 8 projecting from panel 2 on the rear side, the contact portions 7 are in abutment on the board 4 and thus lock it between the support ribs 8 and the contact portions 7.

At the longitudinal sides of the board 4, recesses 9 are arranged through which the base parts 6 of the catch hooks 5 extend. Laterally, i.e., in longitudinal direction of the board 4, the contact portions 7 rise above the recesses 9 in order to thus exert a retaining pressure onto the board 4.

Now, the insertion of the board 4 will be described. Before the board 4 is inserted, the catch hooks 5 are in the position illustrated in FIG. 2 and FIG. 4, respectively. Upon pressing the board 4 into the operating device 1 in the direction of the panel 2, the border of the board 4 engages on the mutually facing parts of the contact portions 7 that laterally rise above the recess 9, which results in that the opposed catch hooks 5 bend apart. This is possible since, on the one hand, the base part 6 is flexible and, on the other hand, the just mentioned part of the contact portions 7 contacting the board 4 is beveled. Hence, upon progressive movement of the board 4 in the direction of the panel 2, the catch hooks 5 are pressed further apart, i.e., moved away from each other. The board 4 is moved until it is supported on the support ribs 8. When the board 4 has reached this position, it has passed the beveled inner parts of the contact portions 7 along which it has slid so that the catch hooks 5 are not pressed further outward. Because of the bias of the flexible base parts 6, the catch hooks 5 return into the position shown in FIG. 2 and FIG. 4, respectively, the contact portions now being supported on the rear side of the board 4 facing away from the panel 2 so that the board 4 is fixed between the support ribs 8 and the contact portions 7 (FIGS. 2 and 5, see also FIGS. 6 and 7).

With the base part 6, the contact portions 7 form an acute angle a (see FIG. 2), respectively, so that the contact portion 7 contacts the board 4 only with an edge or a relatively narrow surface. This facilitates the sliding of the contact portions 7 on the board 4 when the catch hooks 5 catch or snap in upon insertion of the board 4.

Figure 2:
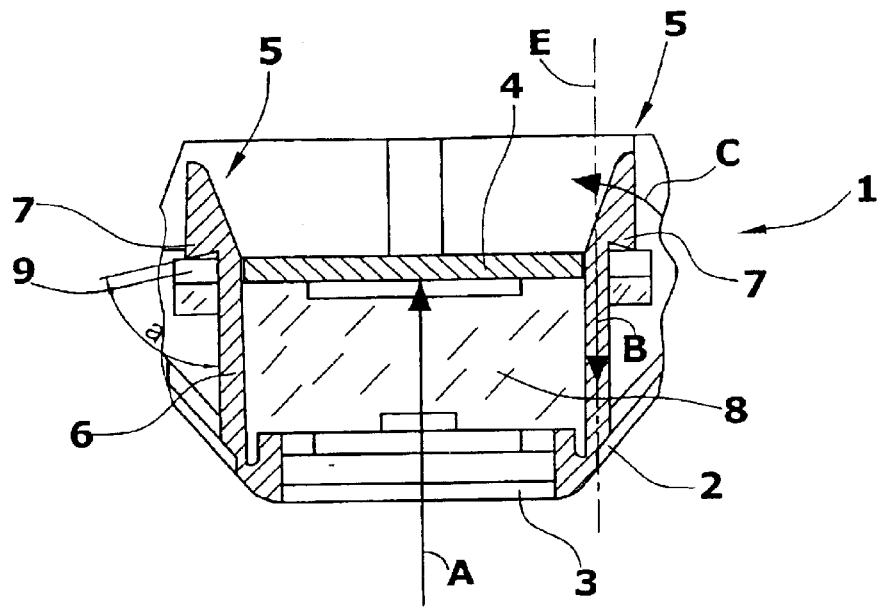
FIG. 2 shows a sectional view of the operating device taken along the line II—II in FIG. 3.
Figure 3:
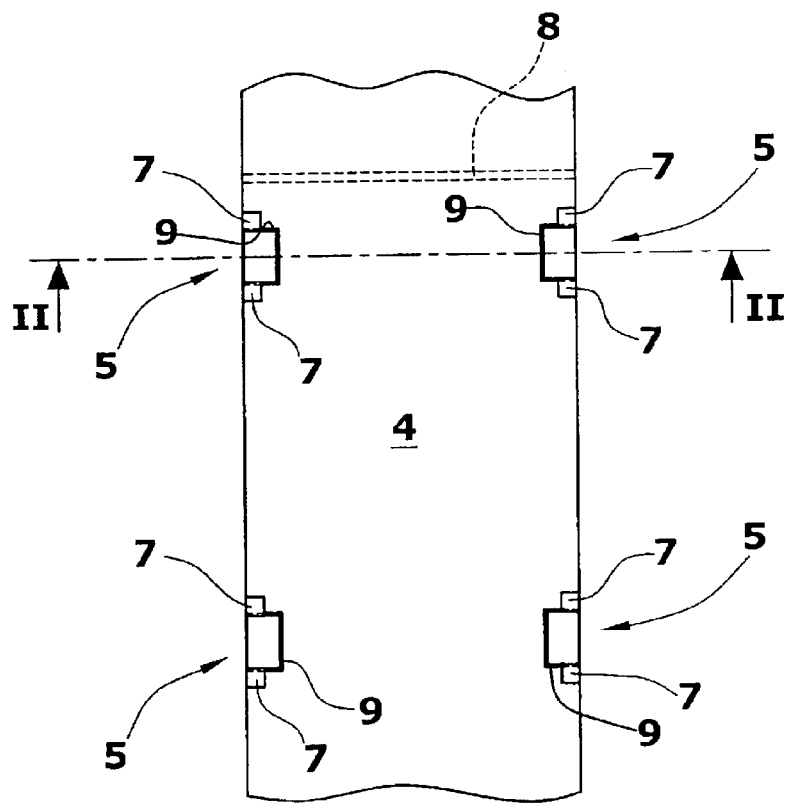
FIG. 3 shows a view of the rear of the operating device for clarification of the locking of the board to the front panel.
Figure 4:
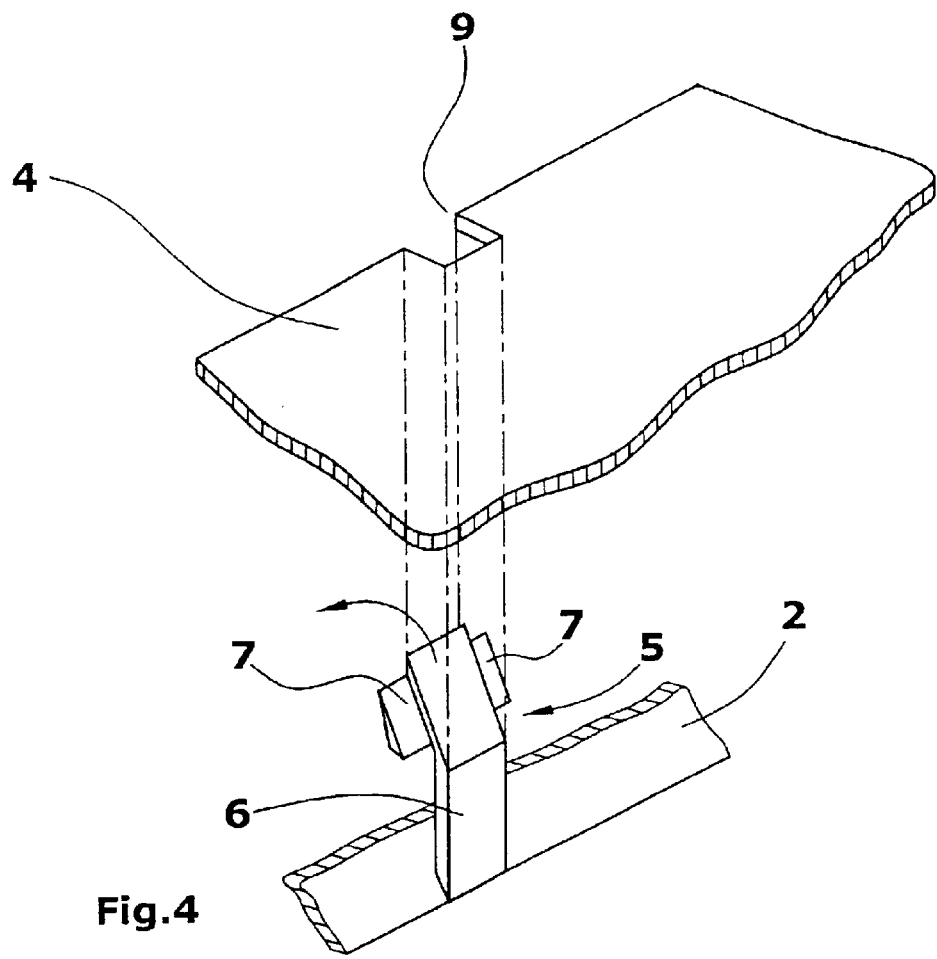
FIG. 4 shows a perspective (exploded) view for clarification of the interaction between the catch hook and the board.
Figure 5:
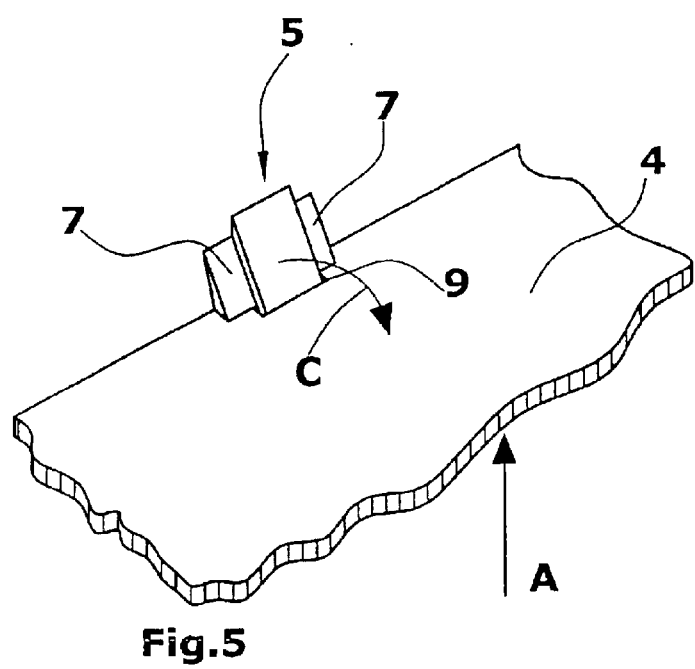
FIG. 5 shows a perspective view of the catch hook and the board in the assembled state of the board and the front panel.
Figure 6:
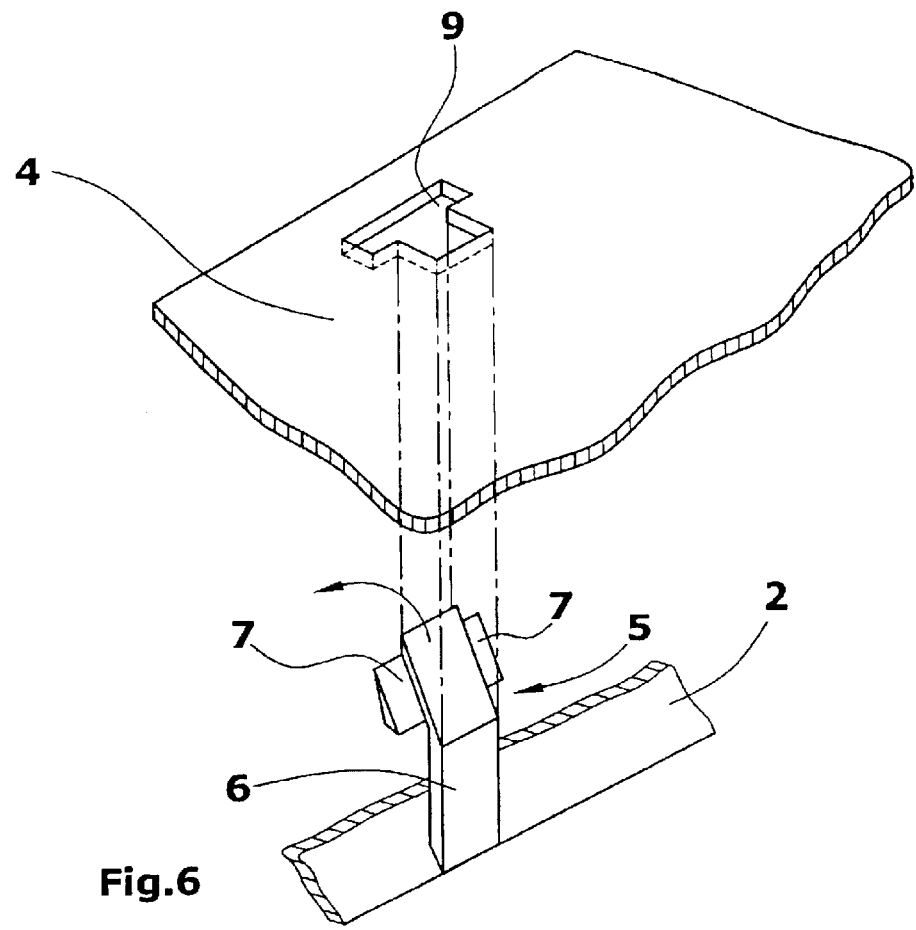
FIG. 6 shows a perspective view of the catch hook and the board according to an alternate embodiment of the present invention.
Figure 7:
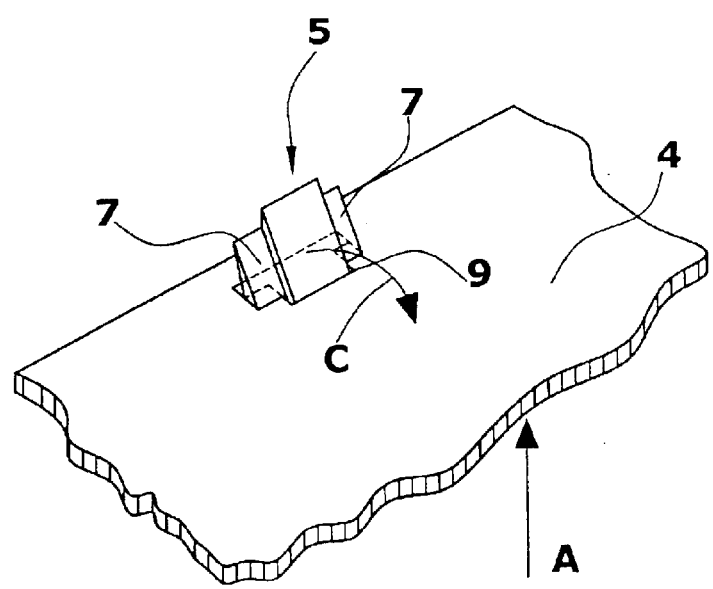
FIG. 7 shows a perspective view of the catch hook and the board in the assembled state of the board and the front panel according to an alternate embodiment of the present invention.

If now the passenger presses a key button 3, a force acts upon the board 4 in the direction of arrow A (see FIG. 2). In spite of this force, the board 4 has to stay in its position since otherwise, the operatability of the operating device 1 is no longer guaranteed. The force applied onto the board 4 by the key button 3 generates a resulting pulling force in the catch hooks 5 in the direction of arrow B. Since the force induction into the catch hook is effected outside the neutral plane E of the base part 6, namely at the supported edge of the contact portion 7, a torque in the direction of arrow C develops. The direction of this torque leads to that the catch hooks 5 contact the board 4 even more strongly upon the exertion of force in the direction of arrow A onto board 4. Hence, the board 4 is held the faster the greater the force is that is exerted upon it. The strength of the exerted torque can be set via the distance of the edge of the contact portion 7 supported on the board 4 to the base part 6. The farther the edge is away from the base part 6, the greater the torque exerted onto catch hooks 5 will be.

If the board 4 is to be taken out of the operating device 1 for purposes of repair or exchange, the catch hooks 5 are bent apart until the contact portion 7 is located outside the board 4, i.e. do not abut on board 4 anymore. Then, the board 4 can be taken out in a simple manner.

Figure 8:
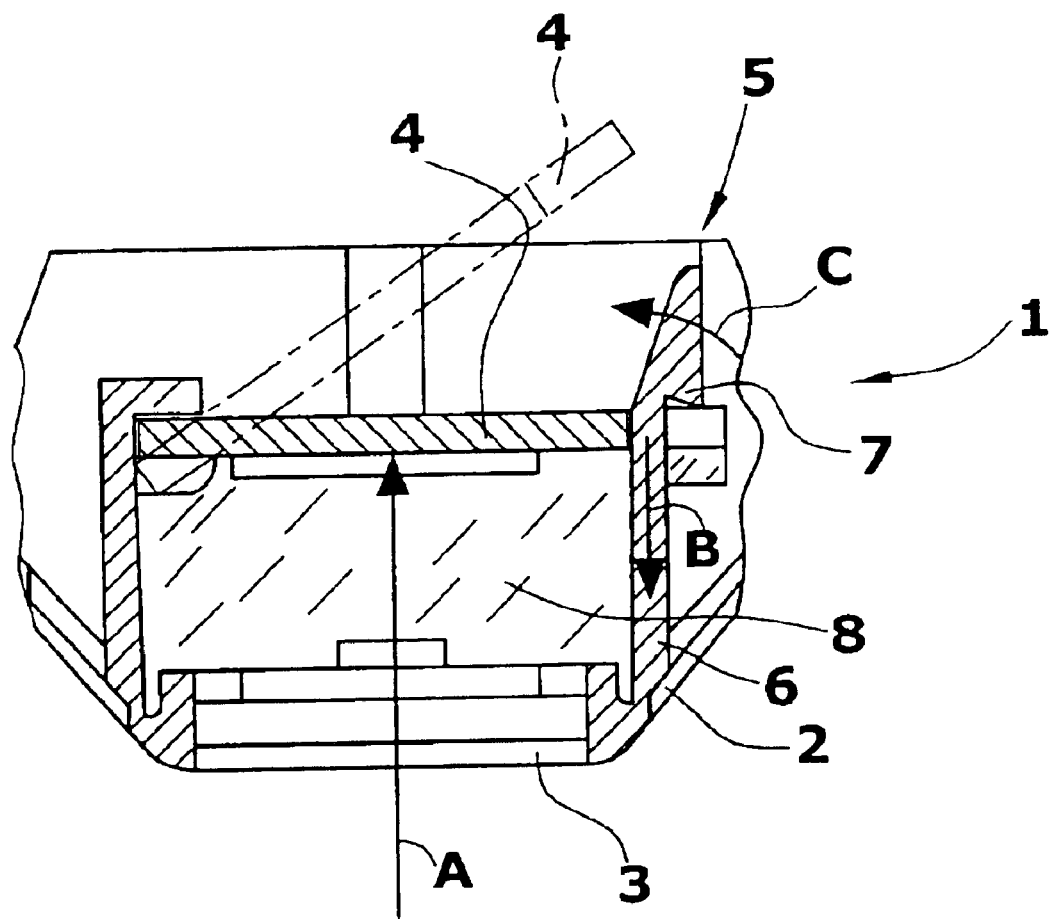
FIG. 8 shows the catch hook and board according to an alternate embodiment.

The invention has been described above with respect to the use of at least one pair of catch hooks that are arranged at both sides of the board. It is also conceivable, however, that there is/are one or more catch hooks of the above-described kind at one border of the board only. As shown in FIG. 8, for example, at the opposed border of the board, the board is encompassed by a rigid encompassing projection, for example, behind which the board is inserted so as to extend obliquely to be then locked with the catch hooks by pivoting. In doing so, the base pad of each catch hook arranged on one side of the board faces the opposed board border br retaining point (e.g., encompassing projection), while its contact portion faces away from this board border.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An operating device for a vehicle, comprising:
   a board; and
   at least two encompassing elements receiving the board between them, each of which comprises a contact portion for retaining the board and a base part for supporting the contact portion,
   wherein at least one of the encompassing elements is configured as an elastic catch hook,
   wherein the contact portion of the at least one catch hook is arranged on its respective base part such that the contact portion faces away from the other encompassing element, and
   wherein, upon exertion of a force on the board, in the direction of the contact portion of the at least one catch hook, the at least one catch hook can be subjected to a torque towards the respective other encompassing element.

2. The operating device of claim 1, wherein the at least one catch hook has an acute angle between its contact portion and its base part.

3. The operating device of claim 1, wherein the base part of the at least one catch hook is elastically bendable.

4. The operating device of claim 1, wherein a recess for the at least one catch hook is provided in the board at the border.

5. The operating device of claim 4, wherein the contact portion of the catch hook rises above the recess in the board at two opposed borders of the recess and/or at the border of the recess connecting these two borders.

6. The operating device of claim 1, wherein the board is a printed circuit board for electric and/or electronic circuits and/or components.

7. The operating device of claim 1, wherein the at least two encompassing elements are configured as elastic catch hooks, respectively, and that the base parts of the catch hooks face each other and the contact portions face away from each other, each catch hook experiencing a torque in the direction of the respectively other catch hook when the board is loaded.

8. The operating device according to claim 1, wherein the operating device includes at least one aperture on a surface thereof for receiving a key button.

9. A structure for retaining a circuit board, the structure comprising:
   at least one aperture formed on a surface of the structure for receiving a key button; and
   at least two projections extending from the surface of the structure for removably retaining the circuit board therebetween,
   wherein at least one of the two projections includes a contact portion, the contact portion having a lower surface that forms an angle with respect to a surface of the circuit board such that only a portion of the lower surface contacts the surface of the circuit board in an installed state and such that the portion of the lower surface contacting the surface of the circuit board faces away from both of the at least two projections, and
   wherein, when a force is exerted onto the circuit board via the key button, the at least one projection containing the contact portion exerts a torque onto the circuit board in a direction towards the other projection.

10. The structure according to claim 9, wherein the contact portion has a beveled surface for facilitating installment of the circuit board

* * * * *